United States Patent
Ho et al.

(10) Patent No.: US 7,038,327 B2
(45) Date of Patent: May 2, 2006

(54) ANISOTROPIC CONDUCTIVE FILM BONDING PAD

(75) Inventors: Sheng-Hsiung Ho, Jhudong Township, Hsinchu County (TW); Chuan-Mao Wei, Jhudong Township, Hsinchu County (TW); Ke-Feng Lin, Taipei (TW)

(73) Assignee: AU Optronics Corp., (TW)

( * ) Notice: Subject to any disclaimer, the term of this patent is extended or adjusted under 35 U.S.C. 154(b) by 0 days.

(21) Appl. No.: 10/787,801

(22) Filed: Feb. 26, 2004

(65) Prior Publication Data

US 2005/0098902 A1 May 12, 2005

Related U.S. Application Data

(60) Provisional application No. 60/519,186, filed on Nov. 11, 2003.

(51) Int. Cl.
*H01L 23/48* (2006.01)
*H01L 23/06* (2006.01)

(52) U.S. Cl. .................. 257/786; 257/772; 257/779; 257/729; 257/730

(58) Field of Classification Search .............. 257/666, 257/722, 672, 673, 786, 772, 779, E23.015, 257/E23.02, E23.23, E23.079, E21.508, E21.509, 257/E21.519; 438/612–617
See application file for complete search history.

(56) References Cited

U.S. PATENT DOCUMENTS

| 5,539,243 | A | * | 7/1996 | Matsuki | 257/584 |
| 5,726,489 | A | * | 3/1998 | Matsuda et al. | 257/659 |
| 5,749,997 | A | * | 5/1998 | Tang et al. | 156/249 |
| 5,770,305 | A | | 6/1998 | Terasaka | |
| 5,907,180 | A | * | 5/1999 | Johansson et al. | 257/580 |
| 6,029,125 | A | * | 2/2000 | Hagen et al. | 704/201 |
| 6,268,643 | B1 | * | 7/2001 | Russell | 257/666 |
| 6,310,390 | B1 | * | 10/2001 | Moden | 257/668 |
| 6,424,028 | B1 | * | 7/2002 | Dickinson | 257/678 |
| 6,445,061 | B1 | * | 9/2002 | Corisis | 257/666 |
| 6,712,129 | B1 | * | 3/2004 | Lee | 165/104.21 |
| 6,831,353 | B1 | * | 12/2004 | Schoenfeld et al. | 257/676 |
| 2002/0111055 | A1 | | 8/2002 | Matsumura et al. | |

* cited by examiner

*Primary Examiner*—Jasmine Clark
(74) *Attorney, Agent, or Firm*—Duane Morris LLP

(57) ABSTRACT

Enhanced ACF bonding pads for use in conjunction with anisotropic conductive film (ACF) in electronic devices, such as, liquid crystal display panels and plasma display panels have at least two finger-like portions. Such bonding pads, typically provided on a flexible wiring lead, when bonded to other metal structures via the ACF film, make better electrical contact with the other metal structures because the spaces between the finger-like portions of the improved bonding pads allow the ACF film's binder material to reside between the finger-like portions preventing the bonding pad metal in the center region of the bonding pad from separating away from the other metal structures.

17 Claims, 7 Drawing Sheets

ANISOTROPIC CONDUCTIVE FILM BONDING PAD

CROSS REFERENCE TO RELATED APPLICATIONS

This application claims benefit under 35 U.S.C. § 119(e) of U.S. Provisional Patent Application No. 60/519,186, filed on Nov. 11, 2003, which is incorporated herein by reference.

FIELD OF THE INVENTION

The present invention relates to the design of metal terminal pads on devices such as a liquid crystal display to enhance electrical connection made using anisotropic conductive films.

BACKGROUND OF THE INVENTION

Anisotropic conductive films (ACF) are used to make electrical connections in miniature and high-performance electronic equipment that require fine and dense wiring implementations for connecting the terminals of circuit boards. Descriptions of such ACF films and their use can be found in U.S. Pat. No. 5,770,305 and United States Patent Application Publication No. 2002/0111055 A1, the entire disclosure of which are incorporated herein by reference.

Electrical connections made between glass substrates of display devices, such as, liquid crystal displays (LCD) and plasma display panels (PDP) are examples of ACF film applications. In these applications, ACF films are often used to electrically connect flexible wiring leads to one or more metallic terminal pads on the periphery of the display device's glass substrate. The flexible wiring leads are usually made of a flexible polymer and typically have thin metal foil wirings that terminate into ACF bonding pads on the surface of the flexible wiring leads.

FIG. 1 is a cross-sectional view of an ACF film 10 in a typical application. The ACF film 10 is positioned between an ACF bonding pad 20 of a flexible wiring lead 70 and a base terminal pad 30 of a glass substrate 80. The bonding pad 20 and the base terminal pad 30 are generally made of thin metal alloy foils (generally a copper based alloy). The ACF film 10 comprises conductive particles 14 that are coated with an insulation material and dispersed within a binder material 12. When the bonding pad 20 and terminal pad 30 are compressed together, squeezing the ACF film 10, the ACF film 10 acts as the bonding agent bonding the two metal pads together and at the same time also provides the electrical connection between the bonding pad 20 and the terminal pad 30. This bonding method will be referred to herein as pressure bonding.

FIG. 2 is a cross-sectional schematic illustration of the assembly of FIG. 1 after the pads 20 and 30 have been pressure bonded together by a compression force, represented by arrows 50. The electrical connection between the pads 20 and 30 is made by the conductive particles 14 dispersed within the ACF film 10. When the pads 20 and 30 are compressed together, the conductive particles 14 trapped between the pads are squeezed. The compression force 50 should be sufficiently high to crush and deform the conductive particles 14 breaking their coating of insulation material. Thus, metal-to-metal contacts are formed between the crushed conductive particles 14a and the bonding pad 20 and the base terminal pad 30 establishing electrical conduction paths between the pads 20 and 30.

In ACF film 10, the binder material 12 is the adhesive that bonds to the pads 20 and 30 to hold them together. But, when the pads 20 and 30 are compressed together to activate the conductive particles of the ACF film, much of the binder material 12 is squeezed out from between the pads 20 and 30, leaving behind very little binder material 12 between the pads 20 and 30. Thus, as illustrated in FIG. 3, once the compression force 50 is removed, the elasticity of the conductive particles 14a exert force on the pads 20 and 30 causing them to separate. But the abundantly present binder material 12 in the regions C, immediately adjacent to the pads 20 and 30, will keep the periphery regions A of the pads 20 and 30 from separating. Thus, the result is that the peripheral regions A of the bonding pads generally stay bonded together while the bonding pads 20 and 30 are separated in the center region. Therefore, the conductive particles 14a sandwiched between the bonding pads 20 and 30 near the peripheral regions A remain under sufficient compression to form good electrical conduction paths between the bonding pads 20 and 30.

The ACF bonding pads are generally thin metal foils formed on flexible wiring leads so in this example of a typical application, it would be the bonding pad 20, whose center region bows outward and separate away from the base terminal pad 30. Because the base terminal pad 30 is on a rigid glass substrate, it would not flex or bow. In some applications, ACF film may be used to bond to thin ACF bonding pads together. For example, two flexible wiring leads having ACF bonding pads on them may be connected together using an ACF film. In those cases, both of the two mating ACF bonding pads will bow out in the center region since they are both flexible.

Because the center regions of the bonding pads 20 and 30 have separated and are not exerting sufficient compression force on to the conduction particles 14b in the center region, the electrical connection between the bonding pads 20 and 30 are pretty much limited to the peripheral regions A. This problem is also illustrated in FIG. 4, which is a plan view microphotograph of the conventional ACF bonding pad configuration of FIG. 3. The view is taken from above the bonding pad 20. The outline of the conductive particles 14a remaining under compression in the peripheral regions of the bonding pad 20 can be seen through the bonding pad 20.

Thus, an enhanced bonding pad designs in this type of application is needed to improve the electrical contact between the bonding pads utilizing ACF films.

SUMMARY OF THE INVENTION

According to an aspect of the present invention, improved interconnection bonding pad configuration for use with anisotropic conductive films (ACF) is disclosed. Interconnection bonding pads for use with ACF films according to an embodiment of the present invention have at least two finger-like portions.

According to another embodiment of the present invention, a flexible wire lead comprises an interconnection bonding pad for bonding to an anisotropic conductive film, wherein the bonding pad comprises at least two finger-like portions.

The finger-like portions may be defined by at least one notch extending from an edge of the bonding pad toward the center region of the bonding pad.

BRIEF DESCRIPTION OF THE DRAWING

The features shown in the above referenced drawings are not intended to be drawn to scale. Like reference numerals are used to denote like parts throughout the various figures.

DETAILED DESCRIPTION

Figure 5:
FIG. 5 is a schematic illustration of the outline shape of a typical conventional ACF bonding pad.
Figure 6:
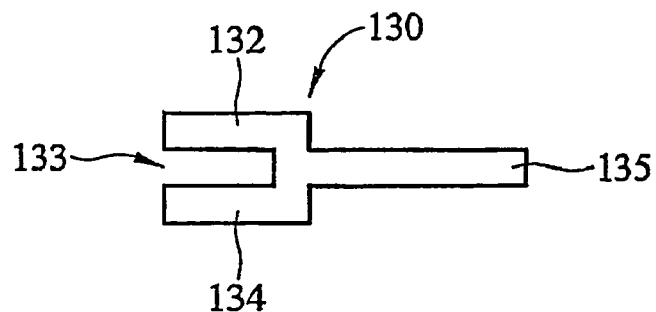
FIGS. 6 through 14 are schematic illustrations of ACF bonding pads according to various embodiments of the present invention.
Figure 7:
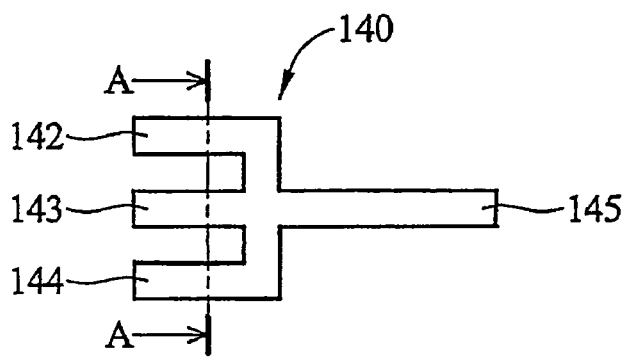
Figure 8:
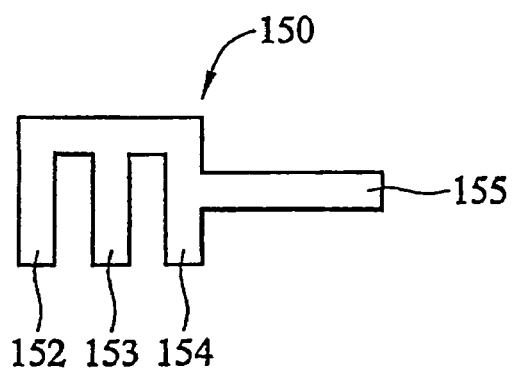
Figure 9:
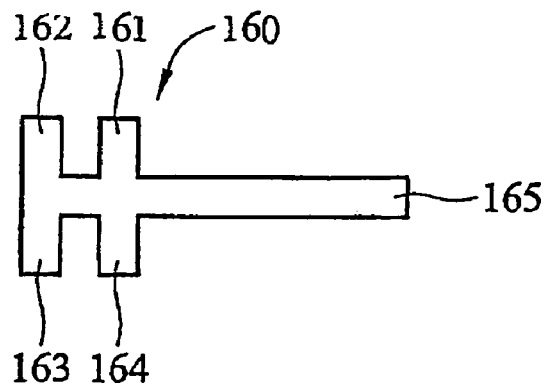
Figure 10:
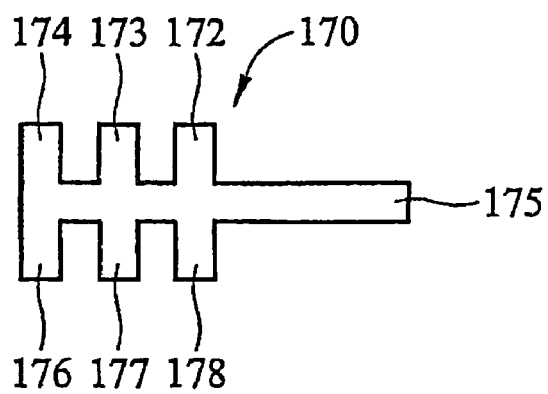
Figure 11:
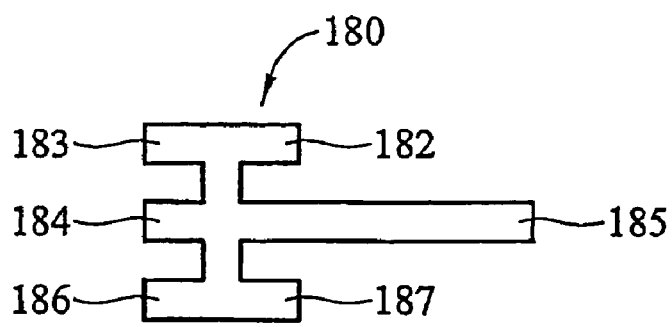
Figure 12:
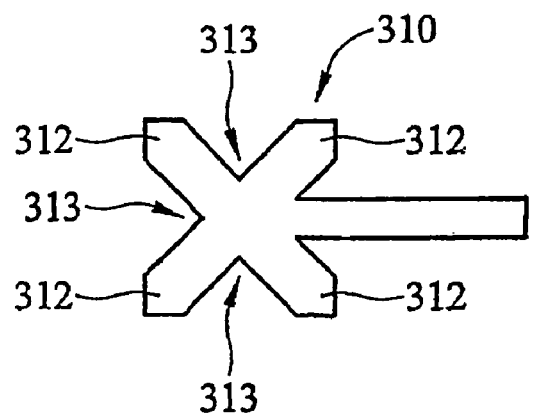
Figure 13:
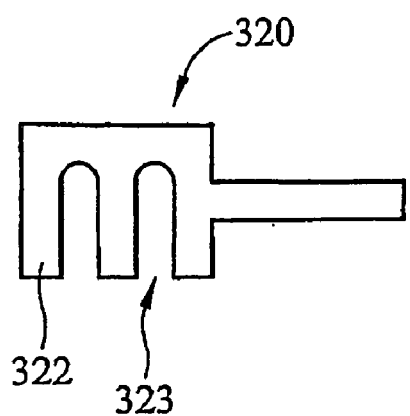
Figure 14:
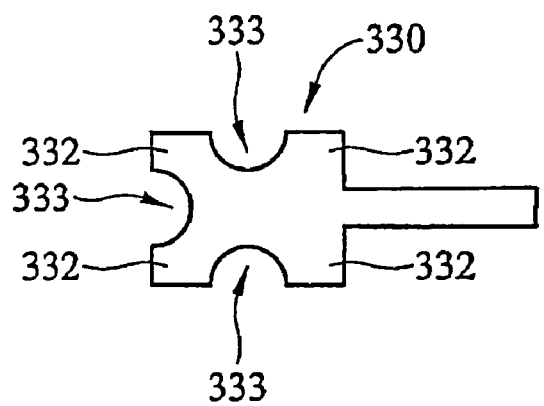

FIG. 5 is a schematic illustration of a conventional ACF bonding pad 120 showing the conventional rectangular outline shape of the bonding pad provided here for the purpose of comparison.

FIGS. 6–14 are schematic illustrations of ACF bonding pads having an improved outline shapes according to various embodiments of the present invention. ACF bonding pads are electrical interconnection pads, generally provided on flexible wiring leads, for pressure bonding using ACF films. The bonding pads are generally made from foil of copper-based alloys or aluminum-based alloys. The methods of forming such metal bonding pad patterns on flexible wiring leads are well known in the art.

The improved ACF bonding pads of FIGS. 6–14 have at least two finger-like portions. For example, the ACF bonding pad 130 of FIG. 6 has two finger-like portions 132 and 134. The finger-like portions 132 and 134, in this example, are oriented parallel to the conductive line 135 connected to the bonding pad 130 but they may be oriented in other directions also. The ACF bonding pad 140 of FIG. 7 has three finger-like portions 142, 143, and 144. The finger-like portions in this example are also oriented parallel to the conductive line 145 connected to the bonding pad 140 but they may be configured to have different orientation relative to the conduction line 145. The ACF bonding pad 150 of FIG. 8 has three finger-like portions 152, 153, and 154 oriented orthogonally to the conductive line 155 connected to the bonding pad 150. The ACF bonding pad 160 of FIG. 9 has four finger-like portions 161, 162, 163 and 164 that are oriented orthogonally to the conductive line 165. The ACF bonding pad 170 of FIG. 10 has six finger-like portions 172, 173, 174, 176, 177, and 178. These finger-like portions are also oriented orthogonally to the conductive line 175 connected to the bonding pad 170. Three of the finger-like portions 172, 173, and 174 extend away from the longitudinal axis of the bonding pad defined by the conductive line 175 while the remaining three finger-like portions 176, 177, and 178 extend away from the longitudinal axis in the opposite direction. The ACF bonding pad 180 of FIG. 11 has five finger-like portions 182, 183, 184, 186, and 187. These finger-like portions are oriented parallel to the conductive line 185. The ACF bonding pad 310 of FIG. 12 has four finger-like portions 312 that radiate outwardly from the center of the geometric center of the bonding pad 310. The ACF bonding pad 320 of FIG. 13 has three finger-like portions 322. The ACF bonding pad 330 of FIG. 14 has four finger-like portions 332. These various shapes for improved ACF bonding pads discussed herein are only exemplary illustrations and are not intended to limit the present invention to those particular shapes.

Another way of defining the finger-like portions of the ACF bonding pads of the present invention is that the finger-like portions may be said to be defined by the spacing or the notches between the finger-like portions. Thus, an improved ACF bonding pads according to an embodiment of the present invention may comprise at least two finger-like portions that are defined by at least one notch extending from an edge of the bonding pad toward the center region of the bonding pad. For example, the ACF bonding pad 130 of FIG. 6 has a notch 133 defining the finger-like portions 132 and 134. The ACF bonding pad 310 of FIG. 12 has three notches 313 defining the four finger-like portions 312. The ACF bonding pad 330 of FIG. 14 has three notches 333 defining the four finger-like portions 332.

Whether the improved ACF bonding pads of the present invention are defined by the finger-like portions or the notches, the desired effect of the novel improved shapes of the ACF pads of the present invention is that unlike the conventional ACF bonding pad, the improved ACF bonding pad is divided into two or more smaller finger-like portions having spacings or notches between them so that the notched areas provide room for the ACF film's binder material to exist within the outline of the bonding pads near the center regions of the bonding pads after the ACF film is compressed between the ACF bonding pad and a mating surface. The mating surface is usually the base terminal pads of a glass substrate in LCD or PDP devices or another ACF bonding pad.

Figure 15:
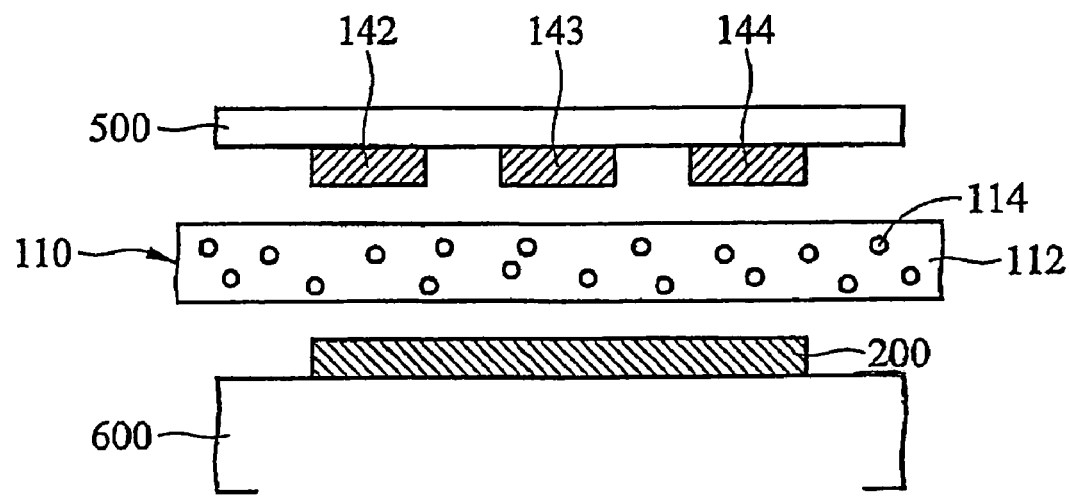
FIG. 15 is a schematic cross-sectional view of the ACF bonding pad of FIG. 7 ready to form an electrical connection with a base terminal pad using an ACF film.

The improvement achieved by the use of the ACF bonding pads of the present invention will now be described with reference to FIGS. 15 and 16. FIG. 15 is a schematic cross-sectional illustration of the embodiment of the ACF bonding pad 140 of FIG. 7 taken along the line A—A. The bonding pad 140 of flexible wiring lead 500 is about to be compressed with an ACF film 110 to form electrical connections with a base terminal pad 200 of a substrate 600. The three finger-like portions 142, 143, and 144 of the terminal ACF bonding pad 140 are shown. The ACF film 110 comprises insulator coated conductive particles 114 dispersed within a binder layer 112.

Figure 1:
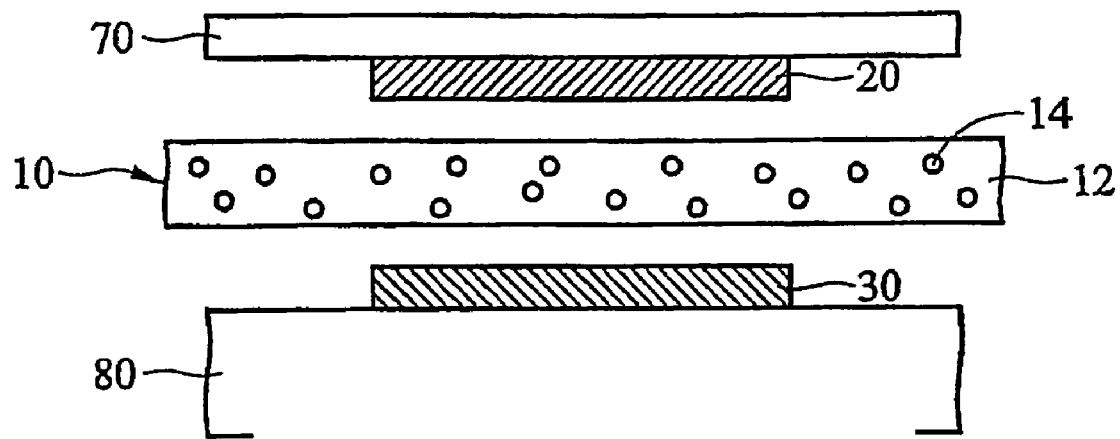
FIG. 1 is a schematic cross-sectional view of a conventional ACF bonding pad ready to be pressure bonded to a second metal pad structure using an ACF film.
Figure 2:
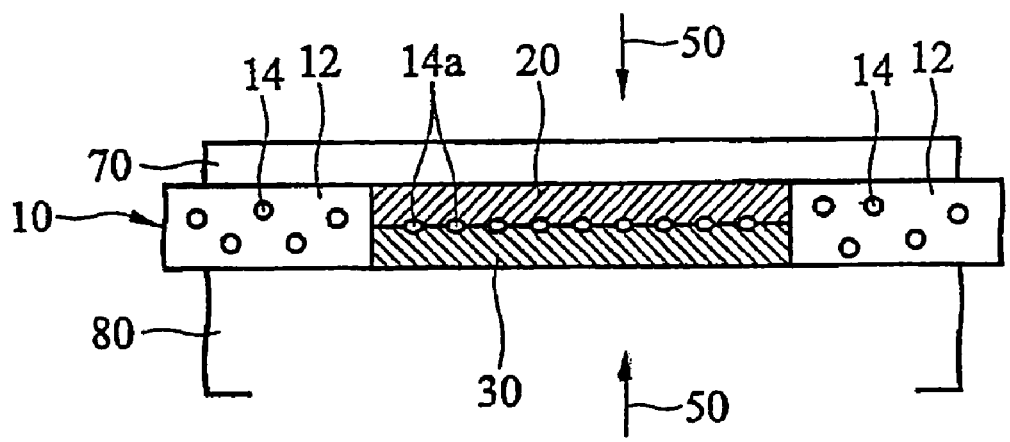
FIG. 2 is a schematic cross-sectional view of the assembly of FIG. 1 while a compression force is applied to form a bond between the ACF bonding pad and the second metal pad structure.
Figure 3:
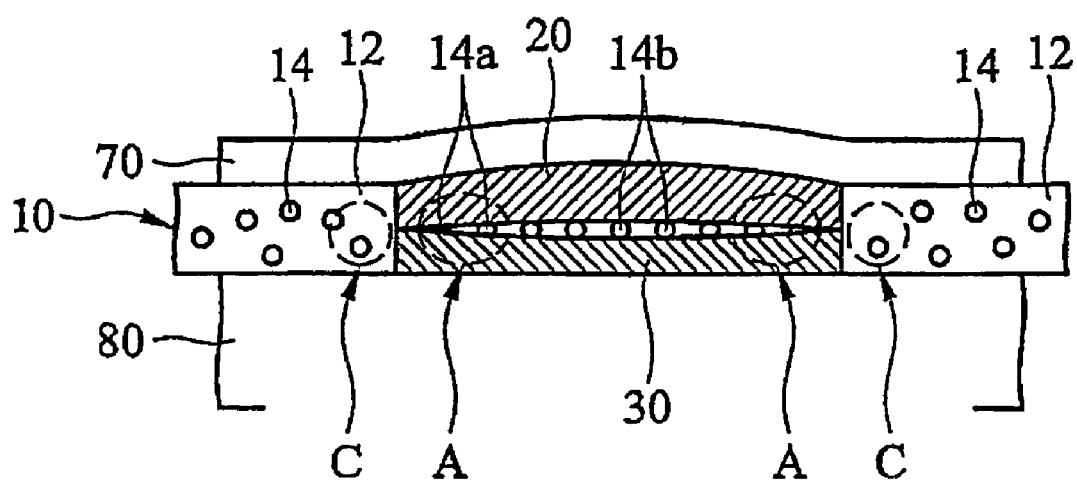
FIG. 3 is a schematic cross-sectional view of the assembly of FIG. 2 after the compression force has been removed.
Figure 4:
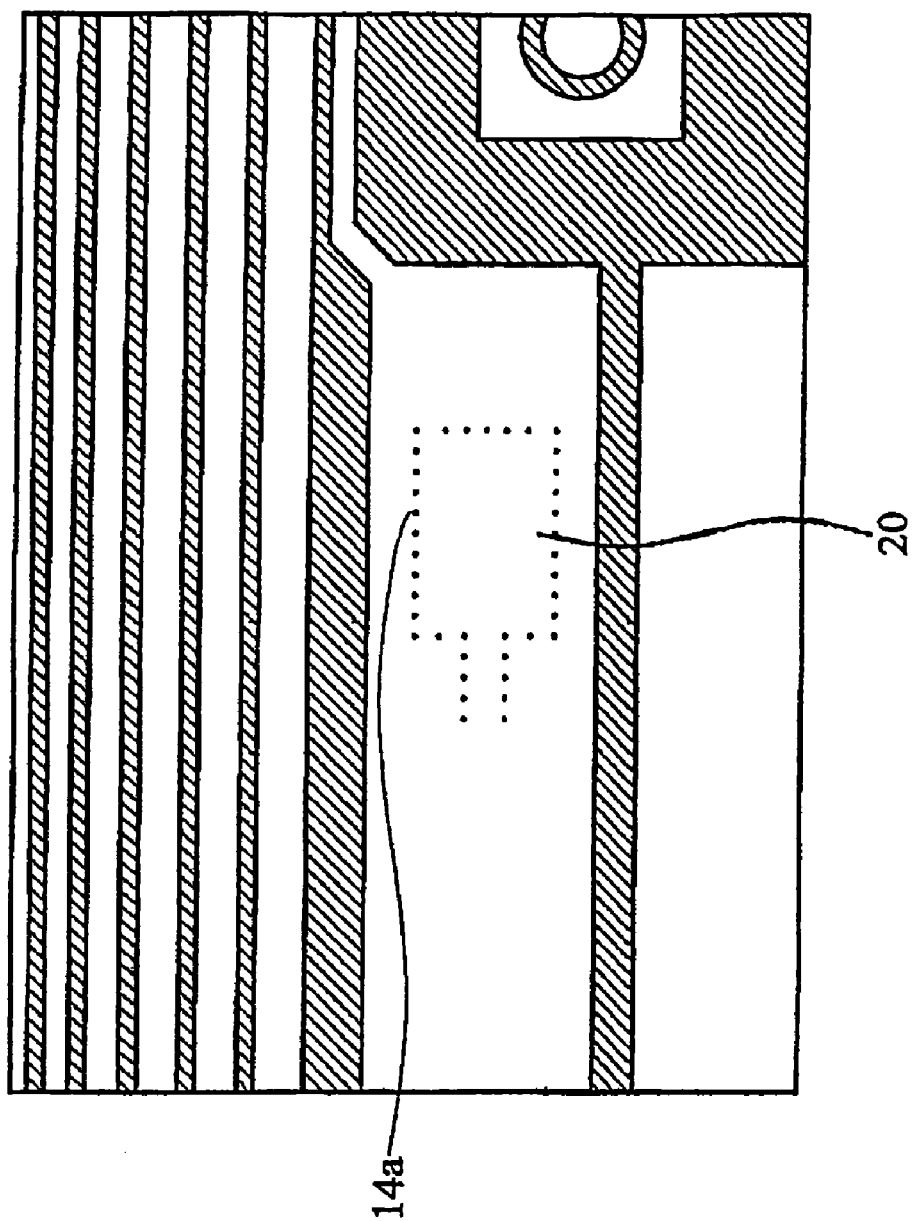
FIG. 4 is a plan view photograph of and example of the ACF bonding pad of FIG. 3 illustrating the outline of the conductive particles near the peripheral regions of the conventional ACF bonding pad.
Figure 16:
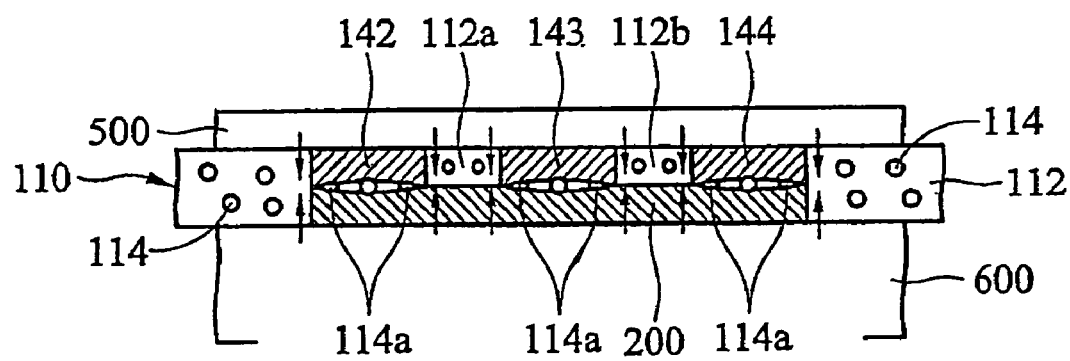
FIG. 16 is a schematic cross-sectional view of the ACF bonding pad of FIG. 15 after the ACF bonding pad has been pressure bonded to the base terminal pad using the ACF film.

FIG. 16 is a cross-sectional schematic illustration of the ACF bonding pad 140 of FIG. 15 after the bonding pad 140 has been bonded to the base terminal pad 200 using the ACF film 110 to form an electrical connection. Each of the three finger-like portions 142, 143, and 144 of the ACF bonding pad 140 makes electrical connection with the base terminal pad 200 through the conductive particles 114a squeezed near the peripheral regions of the finger-like portions 142, 143, and 144. Thus, there are substantially more conductive particles 114a that are squeezed and crushed between the terminal pad 200 and the finger-like portions 142, 143, and 144 when compared to the conventional configuration illustrated in FIG. 3. This provides more electrical conduction paths compared to the conventional ACF bonding pads.

Also, as illustrated in FIG. 16, in this configuration according to an aspect of the present invention, binder materials 112a and 112b remain in the center region of the ACF bonding pad in between the three finger-like portions 142, 143 and 144. The binder materials 112a and 112b are bonded to the flexible wiring lead 500, the base terminal pad 200 and the finger-like portions 142, 143 and 144. Thus, the binder material 112a and 112b will hold the finger-like portions in place against the base terminal pad 200 preventing the finger-like portions from separating away from the base terminal pad 200. This keeps the conduction particles 114a under compression and electrically connecting the three finger-like portions to the base terminal pad 200. The result is that a substantially more electrical conduction paths are formed between the three finger-like portions of the ACF pad 140 and the base terminal pad 200 compared to the conventional configuration of FIG. 3.

The particular outline shapes illustrated in FIGS. 6–11 are also for illustrative purposes only and are not intended to limit the ACF bonding pads of the present invention to those particular shapes. The ACF bonding pad configurations discussed in reference to FIGS. 6–11 may be formed in any dimensions appropriate for a particular ACF film application. The particular width and length of the finger-like portions of a particular ACF bonding pad that is optimal for a given application should be determined in consideration of various factors. Among these factors are the conductive particle size of the ACF film, the thickness of the ACF film, the thickness of the ACF bonding pad metallurgy.

While the foregoing invention has been described with reference to the above embodiments, various modifications and changes can be made without departing from the spirit of the invention. Accordingly, all such modifications and changes are considered to be within the scope of the appended claims.

What is claimed is:

1. An interconnection bonding pad for establishing electrical connection with another metal structure using an anisotropic conductive film, the bonding pad comprising:
   at least two finger-like pad portions,
      wherein the at least two finger-like pad portions are wholly bonded to the another metal structure.

2. The interconnection bonding pad of claim 1, wherein the finger-like pad portions are defined by at least one notch extending from an edge of the bonding pad toward the center region of the bonding pad.

3. The interconnection bonding pad of claim 1, wherein the bonding pad is made from copper-based alloy.

4. The interconnection bonding pad of claim 1, wherein the bonding pad is made from aluminum-based alloy.

5. A flexible wire lead comprising an interconnection bonding pad for bonding to an anisotropic conductive film, wherein the bonding pad comprises at least two finger-like pad portions.

6. The flexible wire lead of claim 5, wherein the finger-like pad portions are defined by at least one notch extending from an edge of the bonding pad toward the center region of the bonding pad.

7. The flexible wire lead of claim 5, wherein the bonding pad is made from copper-based alloy.

8. The flexible wire lead of claim 5, wherein the bonding pad is made from aluminum-based alloy.

9. The flexible wire lead of claim 5, wherein the at least two finger-like pad portions form one of an H- and X-shape pad member.

10. The flexible wire lead of claim 5, wherein the bonding pad has a generally rectilinear shape and the finger-like pad portions are defined by at least one notch extending from an edge of the bonding pad toward the center region of the bonding pad.

11. The flexible wire lead of claim 10, wherein the at least one notch has a rectilinear shape.

12. The flexible wire lead of claim 10, wherein the at least one notch has a curved shape.

13. The interconnection bonding pad of claim 1, wherein the bonding pad has a generally rectilinear shape and the finger-like pad portions are defined by at least one notch extending from an edge of the bonding pad toward the center region of the bonding pad.

14. The interconnection bonding pad of claim 13, wherein the at least one notch has a rectilinear, shape.

15. The interconnection bonding pad of claim 13, wherein the at least one notch has a curved shape.

16. The interconnection bonding pad of claim 1, wherein the at least two finger-like pad portions form one of an H- and X-shape pad member.

17. An interconnection bonding pad for establishing electrical connection with another metal structure using an anisotropic conductive film, the bonding pad composing:
   at least two finger-like pad portions forming one of an H- and X-shape pad member.

* * * * *